US009865556B2

(12) United States Patent
Pendse

(10) Patent No.: US 9,865,556 B2
(45) Date of Patent: *Jan. 9, 2018

(54) SEMICONDUCTOR DEVICE AND METHOD OF SELF-CONFINEMENT OF CONDUCTIVE BUMP MATERIAL DURING REFLOW WITHOUT SOLDER MASK

(71) Applicant: STATS ChipPAC, Ltd., Singapore (SG)

(72) Inventor: Rajendra D. Pendse, Fremont, CA (US)

(73) Assignee: STATS ChipPAC Pte Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/935,669

(22) Filed: Nov. 9, 2015

(65) Prior Publication Data
US 2016/0071813 A1 Mar. 10, 2016

Related U.S. Application Data

(60) Continuation of application No. 14/160,796, filed on Jan. 22, 2014, now Pat. No. 9,219,045, which is a
(Continued)

(51) Int. Cl.
*H01L 21/44* (2006.01)
*H01L 23/48* (2006.01)
(Continued)

(52) U.S. Cl.
CPC ............ *H01L 24/13* (2013.01); *H01L 21/563* (2013.01); *H01L 23/3128* (2013.01);
(Continued)

(58) Field of Classification Search
CPC ... H01L 21/563; H01L 21/565; H01L 21/566; H01L 2224/16; H01L 2224/13099;
(Continued)

(56) References Cited

U.S. PATENT DOCUMENTS 5,186,383 A 2/1993 Melton et al.
5,219,117 A * 6/1993 Lin .................... B23K 35/0244
228/246
(Continued)

FOREIGN PATENT DOCUMENTS

JP 04-355933 9/1992
JP 2005-28037 4/1993
(Continued)

OTHER PUBLICATIONS

Chen et al., "Advanced Flip-Chip Package Production Solution for 40nm/28nm Technology Nodes", International Electron Devices Meeting, pp. 768-771, IEEE 2010.
(Continued)

*Primary Examiner* — Hsien Ming Lee
(74) *Attorney, Agent, or Firm* — Robert D. Atkins; Patent Law Group: Atkins and Associates, P.C.

(57) ABSTRACT

A semiconductor device has a semiconductor die with a die bump pad and substrate with a trace line and integrated bump pad. Conductive bump material is deposited on the substrate bump pad or die bump pad. The semiconductor die is mounted over the substrate so that the bump material is disposed between the die bump pad and substrate bump pad. The bump material is reflowed without a solder mask around the die bump pad or substrate bump pad to form an interconnect. The bump material is self-confined within a footprint of the die bump pad or substrate bump pad. The bump material can be immersed in a flux solution prior to reflow to increase wettability. Alternatively, the interconnect includes a non-fusible base and fusible cap. The volume of bump material is selected so that a surface tension maintains self-confinement of the bump material within the bump pads during reflow.

24 Claims, 6 Drawing Sheets

Related U.S. Application Data continuation of application No. 13/218,653, filed on Aug. 26, 2011, now Pat. No. 8,674,500, which is a continuation of application No. 12/471,180, filed on May 22, 2009, now Pat. No. 8,026,128, and a continuation-in-part of application No. 12/062,293, filed on Apr. 3, 2008, now Pat. No. 7,700,407, which is a division of application No. 10/985,654, filed on Nov. 10, 2004, now Pat. No. 7,368,817.

(60) Provisional application No. 61/141,791, filed on Dec. 31, 2008, provisional application No. 60/518,864, filed on Nov. 10, 2003, provisional application No. 60/533,918, filed on Dec. 31, 2003.

(51) Int. Cl.
*H01L 23/00* (2006.01)
*H01L 21/56* (2006.01)
*H01L 23/31* (2006.01)
*H01L 23/498* (2006.01)

(52) U.S. Cl.
CPC ........ *H01L 23/49838* (2013.01); *H01L 24/11* (2013.01); *H01L 24/12* (2013.01); *H01L 24/16* (2013.01); *H01L 24/29* (2013.01); *H01L 24/81* (2013.01); *H01L 24/02* (2013.01); *H01L 24/48* (2013.01); *H01L 24/75* (2013.01); *H01L 2224/0401* (2013.01); *H01L 2224/0558* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/10175* (2013.01); *H01L 2224/131* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13609* (2013.01); *H01L 2224/16225* (2013.01); *H01L 2224/16238* (2013.01); *H01L 2224/2919* (2013.01); *H01L 2224/29111* (2013.01); *H01L 2224/48* (2013.01); *H01L 2224/73203* (2013.01); *H01L 2224/73265* (2013.01); *H01L 2224/75* (2013.01); *H01L 2224/81191* (2013.01); *H01L 2224/81203* (2013.01); *H01L 2224/81385* (2013.01); *H01L 2224/81801* (2013.01); *H01L 2224/81815* (2013.01); *H01L 2224/83191* (2013.01); *H01L 2224/83192* (2013.01); *H01L 2224/83856* (2013.01); *H01L 2924/00013* (2013.01); *H01L 2924/00014* (2013.01); *H01L 2924/014* (2013.01); *H01L 2924/0105* (2013.01); *H01L 2924/01006* (2013.01); *H01L 2924/01013* (2013.01); *H01L 2924/01015* (2013.01); *H01L 2924/01027* (2013.01); *H01L 2924/01029* (2013.01); *H01L 2924/0132* (2013.01); *H01L 2924/01033* (2013.01); *H01L 2924/01047* (2013.01); *H01L 2924/01049* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/1433* (2013.01); *H01L 2924/1579* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/30105* (2013.01)

(58) Field of Classification Search
CPC ....... H01L 2924/14; H01L 2924/01079; H01L 2924/01029; H01L 2924/01013
USPC ......... 438/107, 108, 612, 613–615; 257/734, 257/737, 778, E23.021
See application file for complete search history.

(56) References Cited

U.S. PATENT DOCUMENTS

| | | |
|---|---|---|
| 5,340,435 A | 8/1994 | Ito et al. |
| 5,378,859 A | 1/1995 | Shirasaki et al. |
| 5,383,916 A | 1/1995 | Brown |
| 5,386,624 A | 2/1995 | George et al. |
| 5,434,410 A | 7/1995 | Kulwicki |
| 5,508,561 A | 4/1996 | Tago et al. |
| 5,519,580 A | 5/1996 | Natarajan et al. |
| 5,587,337 A | 12/1996 | Idaka et al. |
| 5,650,595 A | 7/1997 | Bentlage et al. |
| 5,697,148 A | 12/1997 | Lance, Jr. et al. |
| 5,710,071 A | 1/1998 | Beddingfield et al. |
| 5,731,709 A * | 3/1998 | Pastore ............... G01R 1/0483 324/750.05 |
| 5,795,818 A | 8/1998 | Marrs |
| 5,796,591 A | 8/1998 | Dalal et al. |
| 5,798,285 A | 8/1998 | Bentlage et al. |
| 5,844,782 A | 12/1998 | Fukasawa |
| 5,854,514 A | 12/1998 | Roldan et al. |
| 5,869,886 A | 2/1999 | Tokuno |
| 5,872,399 A | 2/1999 | Lee |
| 5,889,326 A | 3/1999 | Tanaka |
| 5,894,173 A | 4/1999 | Jacobs et al. |
| 5,915,169 A | 6/1999 | Heo |
| 5,930,889 A * | 8/1999 | Klein ..................... H01L 24/81 228/180.21 |
| 5,985,456 A | 11/1999 | Zhou et al. |
| 6,002,172 A | 12/1999 | Desai et al. |
| 6,049,122 A | 4/2000 | Yoneda |
| 6,109,507 A | 8/2000 | Yagi et al. |
| 6,149,122 A | 11/2000 | Berger et al. |
| 6,201,305 B1 | 3/2001 | Darveaux et al. |
| 6,218,630 B1 | 4/2001 | Takigami |
| 6,228,466 B1 | 5/2001 | Tsukada et al. |
| 6,229,209 B1 | 5/2001 | Nakumura et al. |
| 6,229,220 B1 | 5/2001 | Saitoh et al. |
| 6,229,711 B1 | 5/2001 | Yoneda |
| 6,251,704 B1 | 6/2001 | Ohuchi et al. |
| 6,259,159 B1 | 7/2001 | Dalal et al. |
| 6,259,163 B1 | 7/2001 | Ohuchi et al. |
| 6,281,107 B1 | 8/2001 | Moriyama |
| 6,281,450 B1 | 8/2001 | Urasaki et al. |
| 6,281,581 B1 | 8/2001 | Desai et al. |
| 6,297,560 B1 | 10/2001 | Capote et al. |
| 6,297,564 B1 | 10/2001 | Chung |
| 6,324,754 B1 | 12/2001 | DiStefano et al. |
| 6,326,241 B1 | 12/2001 | Belke, Jr. et al. |
| 6,329,605 B1 | 12/2001 | Beroz et al. |
| 6,333,206 B1 | 12/2001 | Ito et al. |
| 6,335,222 B1 | 1/2002 | DiStefano |
| 6,335,568 B1 | 1/2002 | Yuzawa et al. |
| 6,335,571 B1 | 1/2002 | Capote et al. |
| 6,383,916 B1 | 5/2002 | Lin |
| 6,396,707 B1 | 5/2002 | Huang et al. |
| 6,409,073 B1 | 6/2002 | Kaskoun et al. |
| 6,441,316 B1 | 8/2002 | Kusui |
| 6,441,473 B1 | 8/2002 | Deshmukh |
| 6,448,665 B1 | 9/2002 | Nakazawa et al. |
| 6,458,622 B1 | 10/2002 | Keser et al. |
| 6,458,623 B1 | 10/2002 | Goldman et al. |
| 6,459,622 B1 | 10/2002 | Ogura |

(56) References Cited

U.S. PATENT DOCUMENTS

| | | |
|---|---|---|
| 6,462,425 B1 | 10/2002 | Iwasaki et al. |
| 6,472,608 B2 | 10/2002 | Nakayama |
| 6,495,397 B2 | 12/2002 | Kubota et al. |
| 6,510,976 B2 * | 1/2003 | Hwee .................. B23K 1/206 228/180.22 |
| 6,518,674 B2 | 2/2003 | Interrante et al. |
| 6,518,678 B2 | 2/2003 | James et al. |
| 6,550,666 B2 | 4/2003 | Chew et al. |
| 6,556,268 B1 | 4/2003 | Lee et al. |
| 6,563,712 B2 | 5/2003 | Akram et al. |
| 6,573,610 B1 | 6/2003 | Tsai |
| 6,577,014 B2 | 6/2003 | Shen et al. |
| 6,578,754 B1 | 6/2003 | Tung |
| 6,592,019 B2 | 7/2003 | Tung |
| 6,600,234 B2 | 7/2003 | Kuwabara et al. |
| 6,608,388 B2 | 8/2003 | Lin et al. |
| 6,644,536 B2 | 11/2003 | Ratificar et al. |
| 6,660,560 B2 | 12/2003 | Chaudhuri et al. |
| 6,661,084 B1 | 12/2003 | Peterson et al. |
| 6,664,483 B2 | 12/2003 | Chong et al. |
| 6,678,948 B1 | 1/2004 | Benzler et al. |
| 6,681,982 B2 | 1/2004 | Tung |
| 6,707,162 B1 | 3/2004 | Ho et al. |
| 6,710,458 B2 | 3/2004 | Seko |
| 6,734,557 B2 | 5/2004 | Taniguchi et al. |
| 6,737,295 B2 | 5/2004 | Pendse et al. |
| 6,768,190 B2 | 7/2004 | Yang et al. |
| 6,774,474 B1 | 8/2004 | Caletka et al. |
| 6,774,497 B1 | 8/2004 | Qi et al. |
| 6,780,673 B2 | 8/2004 | Venkateswaran |
| 6,780,682 B2 | 8/2004 | Pendse |
| 6,787,918 B1 | 9/2004 | Tsai et al. |
| 6,798,072 B2 | 9/2004 | Kajiwara et al. |
| 6,809,262 B1 | 10/2004 | Hsu |
| 6,818,545 B2 | 11/2004 | Lee et al. |
| 6,821,878 B2 | 11/2004 | Danvir |
| 6,849,944 B2 | 2/2005 | Murtuza et al. |
| 6,853,076 B2 | 2/2005 | Datta et al. |
| 6,870,276 B1 | 3/2005 | Moxham et al. |
| 6,888,255 B2 | 5/2005 | Murtuza et al. |
| 6,913,468 B2 * | 7/2005 | Dozier, II ............ B23K 20/004 257/E21.503 |
| 6,913,948 B2 | 7/2005 | Caletka et al. |
| 6,927,489 B1 | 8/2005 | Yaguchi et al. |
| 6,943,058 B2 | 9/2005 | Chaudhuri et al. |
| 6,974,659 B2 | 12/2005 | Su et al. |
| 7,005,585 B2 | 2/2006 | Ishizaki |
| 7,005,743 B2 | 2/2006 | Iwatsu et al. |
| 7,005,750 B2 | 2/2006 | Liu |
| 7,049,705 B2 | 5/2006 | Huang |
| 7,057,284 B2 | 6/2006 | Chauhan et al. |
| 7,064,435 B2 | 6/2006 | Chung et al. |
| 7,098,407 B2 | 8/2006 | Kim et al. |
| 7,101,781 B2 | 9/2006 | Ho et al. |
| 7,102,222 B2 | 9/2006 | Kuo et al. |
| 7,102,239 B2 | 9/2006 | Pu et al. |
| 7,112,524 B2 | 9/2006 | Hsu et al. |
| 7,141,878 B2 | 11/2006 | Homma |
| 7,164,208 B2 | 1/2007 | Kainou et al. |
| 7,173,828 B2 | 2/2007 | Lin et al. |
| 7,183,493 B2 | 2/2007 | Garcia et al. |
| 7,224,073 B2 | 5/2007 | Kim |
| 7,242,099 B2 | 7/2007 | Lin et al. |
| 7,271,484 B2 | 9/2007 | Reiss et al. |
| 7,294,451 B2 | 11/2007 | Chiu et al. |
| 7,294,457 B2 | 11/2007 | Kukolj et al. |
| 7,294,929 B2 | 11/2007 | Miyazaki |
| 7,317,245 B1 | 1/2008 | Lee et al. |
| 7,361,990 B2 | 4/2008 | Lu et al. |
| 7,405,484 B2 | 7/2008 | Usui et al. |
| 7,436,063 B2 | 10/2008 | Miyata et al. |
| 7,462,942 B2 | 12/2008 | Tan et al. |
| 7,488,896 B2 | 2/2009 | Saiki et al. |
| 7,521,284 B2 | 4/2009 | Miranda et al. |
| 7,642,660 B2 | 1/2010 | Tay et al. |
| 7,663,248 B2 | 2/2010 | Hedler et al. |
| 7,663,250 B2 | 2/2010 | Jeon et al. |
| 7,670,939 B2 | 3/2010 | Topacio et al. |
| 7,671,454 B2 | 3/2010 | Seko |
| 7,692,314 B2 | 4/2010 | Yang et al. |
| 7,732,913 B2 | 6/2010 | Hsieh et al. |
| 7,750,457 B2 | 7/2010 | Seko |
| 7,790,509 B2 | 9/2010 | Gerber |
| 7,791,211 B2 | 9/2010 | Chen et al. |
| 7,847,399 B2 | 12/2010 | Masumoto |
| 7,847,417 B2 | 12/2010 | Araki et al. |
| 7,851,928 B2 | 12/2010 | Gallegos et al. |
| 7,898,083 B2 | 3/2011 | Castro |
| 7,902,660 B1 | 3/2011 | Lee et al. |
| 7,902,678 B2 | 3/2011 | Ohuchi et al. |
| 7,902,679 B2 | 3/2011 | Lin et al. |
| 7,932,170 B1 | 4/2011 | Huemoeller et al. |
| 7,947,602 B2 | 5/2011 | Ito et al. |
| 8,129,841 B2 | 3/2012 | Pendse et al. |
| 8,178,392 B2 | 5/2012 | Choi et al. |
| 8,318,537 B2 | 11/2012 | Pendse |
| 2001/0012644 A1 | 8/2001 | Chen |
| 2001/0013423 A1 | 8/2001 | Dalal et al. |
| 2001/0018230 A1 | 8/2001 | Jimarez et al. |
| 2002/0033412 A1 | 3/2002 | Tung |
| 2002/0041036 A1 | 4/2002 | Smith |
| 2002/0070451 A1 | 6/2002 | Burnetter et al. |
| 2002/0070463 A1 | 6/2002 | Chang et al. |
| 2002/0079595 A1 | 6/2002 | Carpenter et al. |
| 2002/0100610 A1 | 8/2002 | Yasuda et al. |
| 2002/0121706 A1 | 9/2002 | Tatsuta et al. |
| 2002/0155637 A1 | 10/2002 | Lee |
| 2002/0179689 A1 | 12/2002 | Tung |
| 2002/0192865 A1 | 12/2002 | Imasu et al. |
| 2003/0019568 A1 | 1/2003 | Liu et al. |
| 2003/0049411 A1 | 3/2003 | Chaudhuri et al. |
| 2003/0057551 A1 | 3/2003 | Datta et al. |
| 2003/0067084 A1 | 4/2003 | Shintani |
| 2003/0116866 A1 | 6/2003 | Cher'Khng et al. |
| 2003/0127734 A1 | 7/2003 | Lee et al. |
| 2003/0127747 A1 | 7/2003 | Kajiwara et al. |
| 2003/0157792 A1 | 8/2003 | Tong et al. |
| 2003/0168748 A1 | 9/2003 | Katagiri et al. |
| 2003/0173108 A1 | 9/2003 | Takano |
| 2003/0175146 A1 | 9/2003 | Yeh et al. |
| 2004/0026107 A1 | 2/2004 | Caldwell et al. |
| 2004/0026484 A1 * | 2/2004 | Yamashita ............ B23K 1/0016 228/180.22 |
| 2004/0027788 A1 | 2/2004 | Chiu et al. |
| 2004/0035909 A1 | 2/2004 | Yeh et al. |
| 2004/0046263 A1 | 3/2004 | Harper et al. |
| 2004/0046264 A1 | 3/2004 | Ho et al. |
| 2004/0056341 A1 | 3/2004 | Endo et al. |
| 2004/0105223 A1 | 6/2004 | Okada et al. |
| 2004/0108135 A1 | 6/2004 | Ashida |
| 2004/0126927 A1 | 7/2004 | Lin et al. |
| 2004/0210122 A1 | 10/2004 | Sieburg |
| 2004/0232560 A1 | 11/2004 | Su |
| 2004/0232562 A1 | 11/2004 | Hortaleza et al. |
| 2005/0046041 A1 | 3/2005 | Tsai |
| 2005/0082654 A1 | 4/2005 | Humpston et al. |
| 2005/0103516 A1 | 5/2005 | Kaneyuki |
| 2005/0224991 A1 | 10/2005 | Yeo |
| 2005/0248037 A1 | 11/2005 | Hung et al. |
| 2006/0131758 A1 | 6/2006 | Dao |
| 2006/0192294 A1 | 8/2006 | Lee |
| 2006/0202331 A1 | 9/2006 | Hu |
| 2006/0216860 A1 | 9/2006 | Pendse |
| 2006/0255473 A1 | 11/2006 | Pendse |
| 2007/0200234 A1 | 8/2007 | Gerber et al. |
| 2007/0259514 A1 | 11/2007 | Otremba |
| 2008/0088013 A1 | 4/2008 | Chew et al. |
| 2008/0093749 A1 | 4/2008 | Gerber et al. |
| 2008/0179740 A1 | 7/2008 | Liao |
| 2008/0213941 A1 | 9/2008 | Pendse |
| 2008/0277802 A1 | 11/2008 | Tsai et al. |
| 2009/0045507 A1 | 2/2009 | Pendse et al. |
| 2009/0057378 A1 | 3/2009 | Hwang et al. |
| 2009/0108445 A1 | 4/2009 | Liang |

(56) References Cited

U.S. PATENT DOCUMENTS

| | | |
|---|---|---|
| 2009/0114436 A1 | 5/2009 | Chen et al. |
| 2009/0146303 A1 | 6/2009 | Kwon |
| 2009/0152716 A1 | 6/2009 | Sohara |
| 2009/0191329 A1 | 7/2009 | Wang |
| 2009/0288866 A1 | 11/2009 | Tsai et al. |
| 2009/0308647 A1 | 12/2009 | Liao |
| 2010/0139965 A1 | 6/2010 | Wang et al. |
| 2011/0008309 A1 | 1/2011 | Bookbinder et al. |
| 2011/0049703 A1 | 3/2011 | Hsu et al. |
| 2011/0241203 A1 | 10/2011 | Nakasato et al. |
| 2013/0214409 A1 | 8/2013 | Pagaila et al. |
| 2013/0277830 A1 | 10/2013 | Yu et al. |

FOREIGN PATENT DOCUMENTS

| | | |
|---|---|---|
| JP | 6503687 | 4/1994 |
| JP | 09-097791 | 8/1997 |
| JP | 10-256307 | 9/1998 |
| JP | 10-256315 | 9/1998 |
| JP | 11145176 | 5/1999 |
| JP | 11233571 | 8/1999 |
| JP | 11330162 | 11/1999 |
| JP | 2000-031204 | 1/2000 |
| JP | 2000-133667 | 12/2000 |
| JP | 2000-349194 A | 12/2000 |
| JP | 2001156203 A | 6/2001 |
| JP | 2001-332583 A | 11/2001 |
| JP | 2001351945 A | 12/2001 |
| JP | 2002270732 A | 9/2002 |
| JP | 2004-221205 A | 5/2004 |
| JP | 2004165283 A | 6/2004 |
| JP | 2005109187 A | 4/2005 |
| JP | 2005333166 A | 12/2005 |
| JP | 2009231657 A | 10/2009 |
| JP | 2010118534 A | 5/2010 |
| KR | 199879438 | 10/1997 |
| KR | 200062333 | 6/1999 |
| SG | 100817 | 7/2004 |
| TW | 530398 B | 5/2003 |
| WO | 9306964 | 4/1993 |
| WO | 0013228 | 3/2000 |
| WO | 03071842 | 8/2001 |
| WO | 2010067610 A1 | 6/2010 |

OTHER PUBLICATIONS

Gerber et al., "Next Generation Fine Pitch Cu Pillar Technology—Enabling Next Generation Silicon Nodes", Electronic Components and Technology Conference, pp. 612-618, 2011.

He et al., "All-Copper Chip-to-Substrate Interconnects Part II. Modeling and Design", Journal of the Electrochemical Society, 155(4):D314-D322, 2008.

Heinen, K. Gail et al., "Multichip Assembly with Flipped Integrated Circuits", IEEE Transactions on Components, Hybrids, and Manufactureing Technology, vol. 12 No. 4, 1989, pp. 650-657.

Kawahara, Toshimi, "SuperCSP", IEEE Transactions on Advanced Packaging, May 2000, pp. 215-219, vol. 23, No. 2.

Lau, John H. et al., "A New Thermal-Fatigue Life Prediction Model for Wafer Level Chip Scale Package (WLCSP) Solder Joints", Journal of Electronic Packaging, vol. 124, 2002, pp. 212-220.

Love, David et al., "Wire Interconnect Technology, A New High-Reliability Tight-Pitch Interconnect Technology", Karl Suss, 1999.

Lu, H. et al., "Predicting Optimal Process Conditions for Flip-Chip Assembly Using Copper Column Bumped Dies", Electronics Packaging Technology Conference, 2002, pp. 338-343.

Pendse et al., "Bon-on-Lead: A Novel Flip Chip Interconnection Technology for Fine Effective Pitch and High I/O Density", Electronic Components and Technology Conference, pp. 16-23, 2006.

Powell, D. O. et al., Flip-Chip on FR-4 Integrated Circuit Packaging, HBN Technology Products, 1993, pp. 182-186.

Schubert, A. et al.. "Numerical and Experimental Investigations of Large IC Flip Chip Attach", Electronic Components and Technology Conference, 2000, pp. 1338-1346.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Yamada, Hiroshi et al., "Advanced copper column based solder bump for flip-chip interconnection", International Symposium on Microelectronics, 1997, pp. 417-422, The British Library—"The world's knowledge".

* cited by examiner

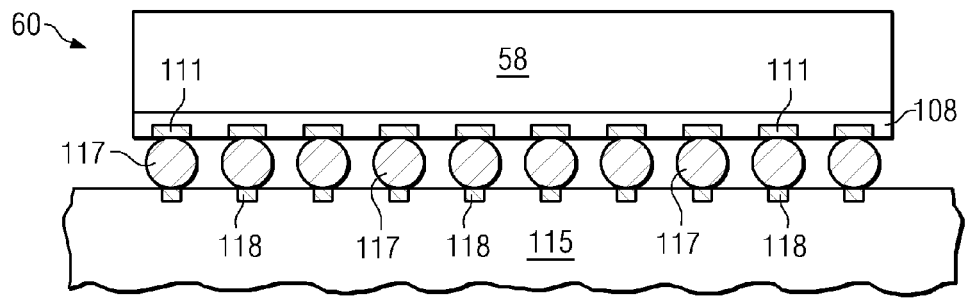
*FIG. 5d*
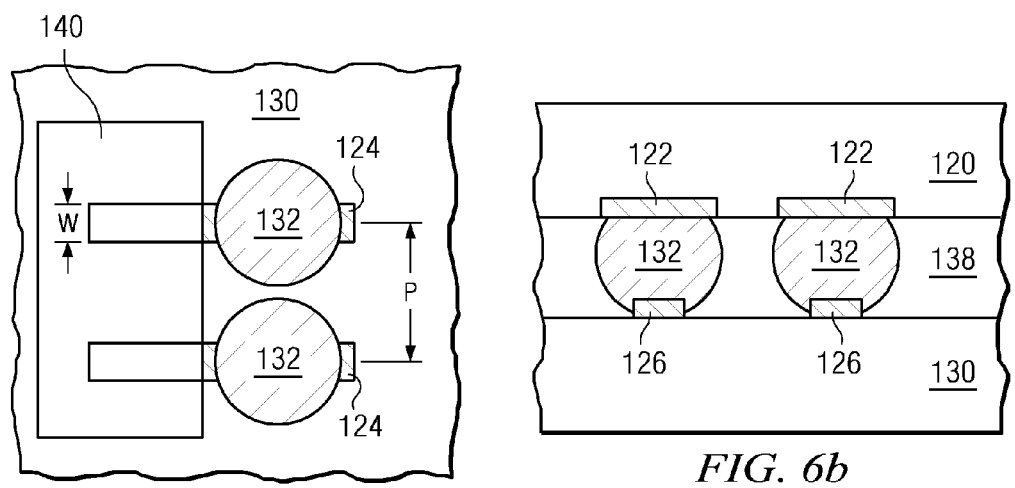
*FIG. 6a*  *FIG. 6b*
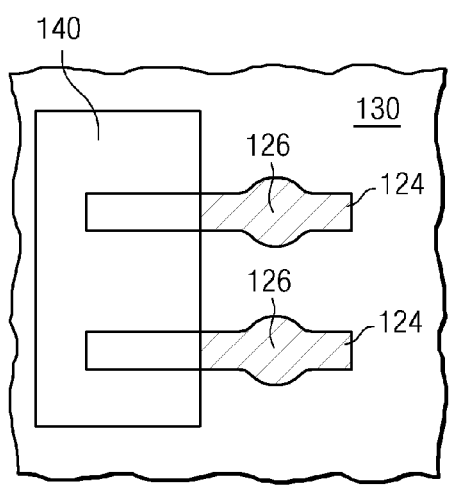 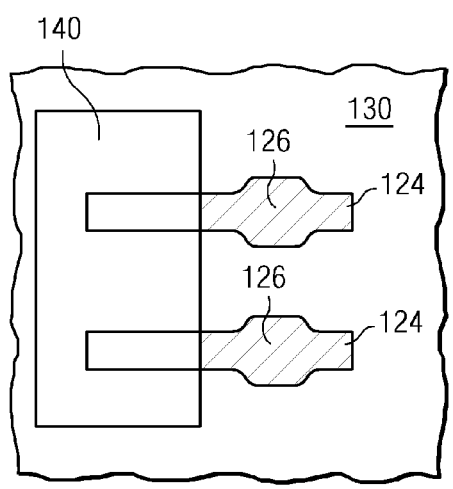
*FIG. 7a*  *FIG. 7b*

SEMICONDUCTOR DEVICE AND METHOD OF SELF-CONFINEMENT OF CONDUCTIVE BUMP MATERIAL DURING REFLOW WITHOUT SOLDER MASK

CLAIM OF DOMESTIC PRIORITY

The present application is a continuation of U.S. patent application Ser. No. 14/160,796, now U.S. Pat. No. 9,219,045, filed Jan. 22, 2014, which is a continuation of U.S. patent application Ser. No. 13/218,653, now U.S. Pat. No. 8,674,500, filed Aug. 26, 2011, which is a continuation of U.S. patent application Ser. No. 12/471,180, now U.S. Pat. No. 8,026,128, reissued as U.S. Pat. No. RE44,579, filed May 22, 2009, which claims the benefit of U.S. Provisional Application No. 61/141,791, filed Dec. 31, 2008, which further is a continuation-in-part of U.S. application Ser. No. 12/062,293, now U.S. Pat. No. 7,700,407, reissued as U.S. Pat. No. RE44,355, filed Apr. 3, 2008, which is a division of U.S. application Ser. No. 10/985,654, now U.S. Pat. No. 7,368,817, filed Nov. 10, 2004, which claims the benefit of U.S. Provisional Application No. 60/518,864, filed Nov. 10, 2003 and U.S. Provisional Application No. 60/533,918, filed Dec. 31, 2003, all of which applications are incorporated herein by reference.

FIELD OF THE INVENTION

The present invention relates in general to semiconductor devices and, more particularly, to a semiconductor device and method of providing self-confinement of conductive bump material during reflow without use of a solder mask.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1 illustrates a portion of flip chip type semiconductor device 10 with interconnect 12 metallurgically and electrically connected between bump pad 14 and trace line 20 using solder mask 15. A circular solder mask or registration opening (SRO) 16 is formed over substrate 18 to expose trace line 20, as shown in FIG. 2. Trace line 20 is a straight conductor with optional bump pad for mating to interconnect 12. SRO 16 confines the conductive bump material on the bump pad of trace line 20 during reflow and prevents the molten bump material from leeching onto the trace lines, which can cause electrical shorts to adjacent structures. SRO 16 is made larger than the trace line or bump pad. SRO 16 is typically circular in shape and made as small as possible to reduce the pitch of trace line 20 and increase routing density.

In typical design rules, the minimum escape pitch of trace line 20 is limited by the fact that SRO 16 must be at least as large as the base diameter (D) of interconnect 12 plus a solder mask registration tolerance (SRT). In addition, a minimum ligament (L) of solder mask material is needed between adjacent openings by virtue of the limits of the solder mask application process. More specifically, the minimum escape pitch is defined as P=D+2*SRT+L. In one embodiment, D is 100 micrometers ($\mu$m), SRT is 10 $\mu$m, and L is 60 $\mu$m, hence, the minimum escape pitch is 100+2*10+60=180 $\mu$m.

FIGS. 3a and 3b show a top view and cross-sectional view of another conventional arrangement with trace line 30 routed between traces lines 32 and 34 and bumps 36 and 38 on substrate 40. Bumps 36 and 38 electrically connect semiconductor die 42 to substrate 40. Solder mask 44 overlays bump pads 46 and 48. The minimum escape pitch of trace line 30 is defined by P=D/2+SRT+L+W/2, where D is bump base diameter, SRT is solder mask registration tolerance, W is trace line width, and L is the ligament separation between SRO and adjacent structures. In one embodiment, D is 100 µm, SRT is 10 µm, W is 30 µm, and L is 60 µm. The minimum escape pitch of trace lines 30-34 is 100/2+10+60+30/2=135 µm. As the demand for high routing density increases, a smaller escape pitch is needed.

SUMMARY OF THE INVENTION

A need exists to minimize escape pitch of trace lines for higher routing density. Accordingly, in one embodiment, the present invention is a method of making a semiconductor device comprising the steps of providing a substrate including a first conductive layer comprising an interconnect site, forming an interconnect structure over the interconnect site of the first conductive layer, and reflowing the interconnect structure self-confined over the interconnect site.

In another embodiment, the present invention is a method of making a semiconductor device comprising the steps of providing a first substrate including a first conductive layer, and disposing an interconnect structure self-confined over the first conductive layer.

In another embodiment, the present invention is a semiconductor device comprising a first substrate including a first conductive layer. An interconnect structure is reflowed and self-confined over the first conductive layer.

In another embodiment, the present invention is a semiconductor device comprising a first substrate including a first conductive layer. An interconnect structure is self-confined over the first conductive layer.

BRIEF DESCRIPTION OF THE DRAWINGS

FIGS. 5*a*-5*d* illustrate further detail of the representative semiconductor packages mounted to the PCB;

FIGS. 6*a*-6*b* is a semiconductor device with interconnects reflowed on trace lines without a solder mask;

FIGS. 7*a*-7*b* show further detail of the bump pad along the trace line;

DETAILED DESCRIPTION OF THE DRAWINGS

Figure 1:
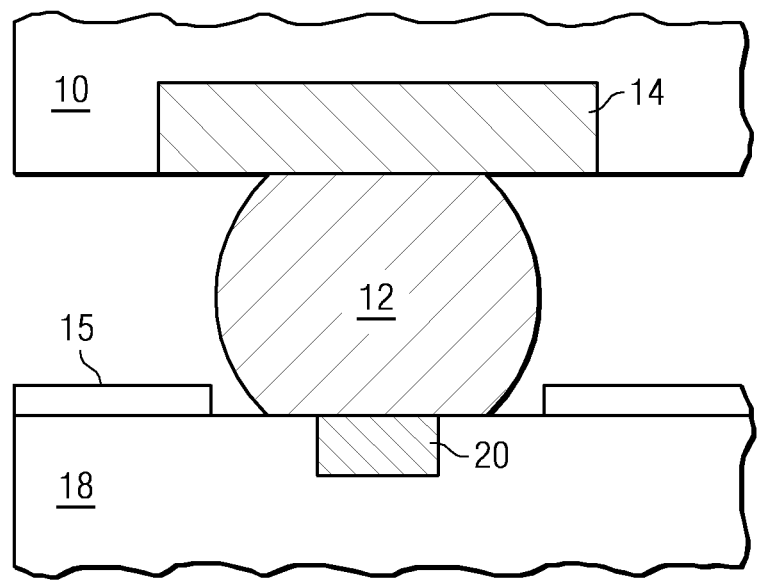
FIG. 1 illustrates a cross-sectional view of a conventional interconnect formed between a semiconductor die and trace line on a substrate.
Figure 2:
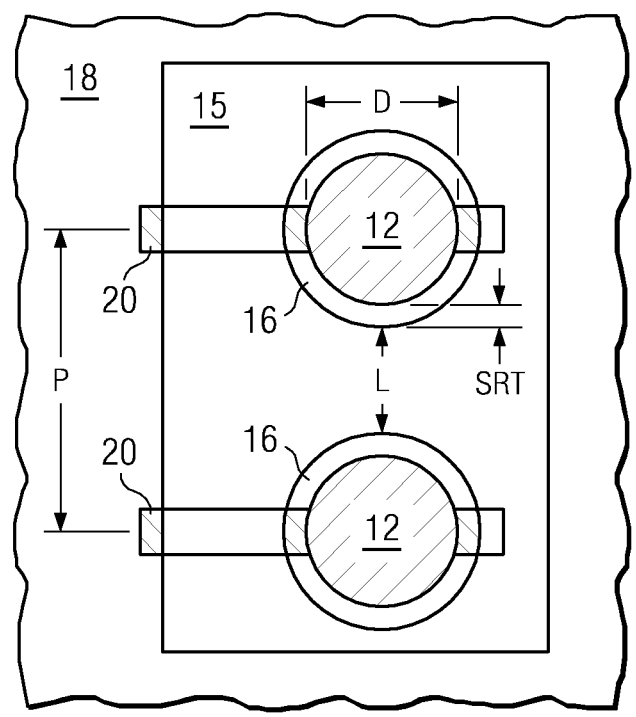
FIG. 2 illustrates a top view of the conventional interconnect formed over the trace line through a solder mask opening.
Figure 3A:
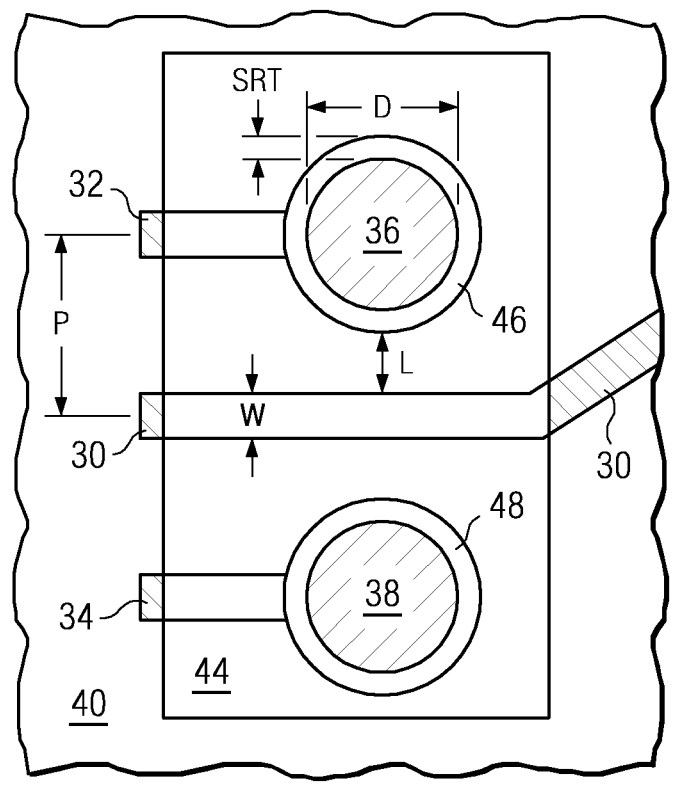
FIGS. 3*a*-3*b* illustrate conventional arrangement of trace lines between interconnects reflowed using a solder mask.
Figure 3B:
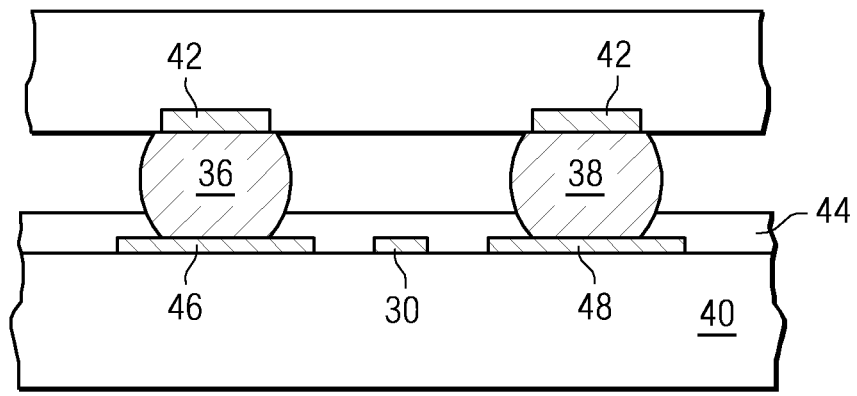

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 4:
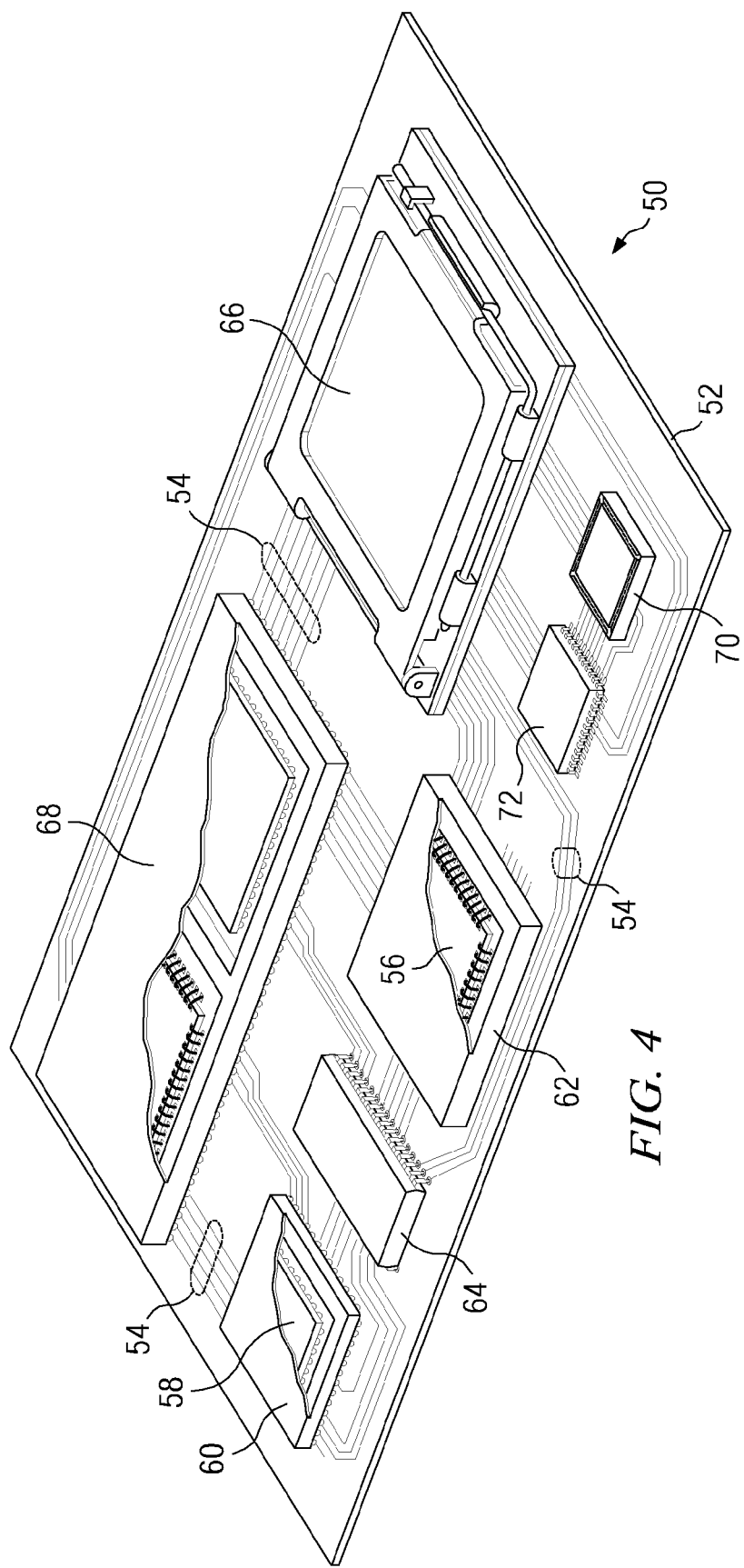
FIG. 4 illustrates a PCB with different types of packages mounted to its surface.

FIG. 4 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 4 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 4, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 5A:
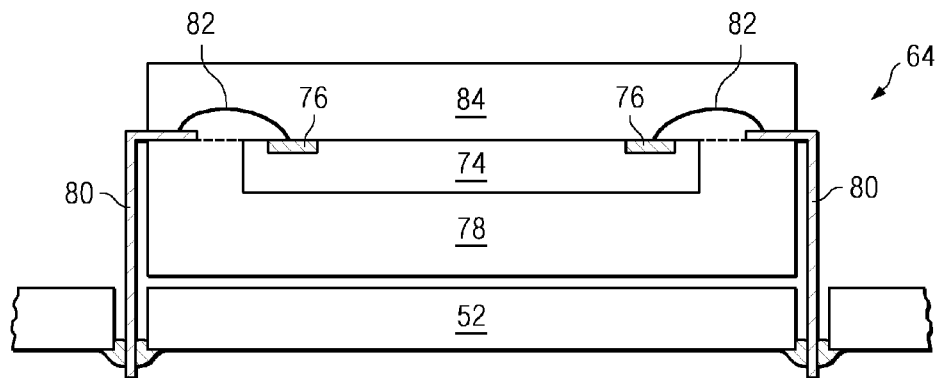

FIGS. 5a-5d show exemplary semiconductor packages. FIG. 5a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

Figure 5B:
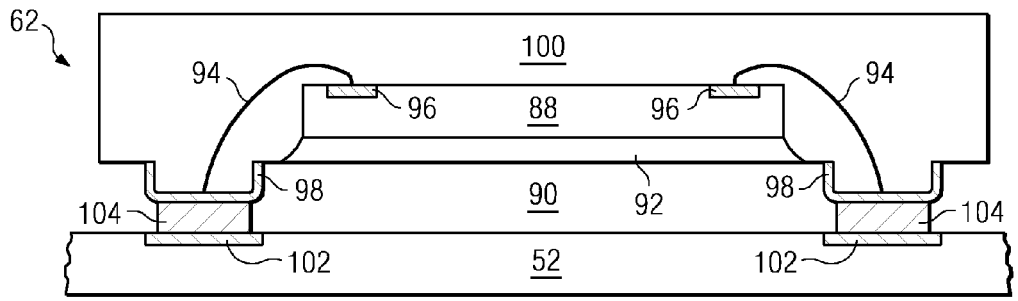

FIG. 5b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 5C:
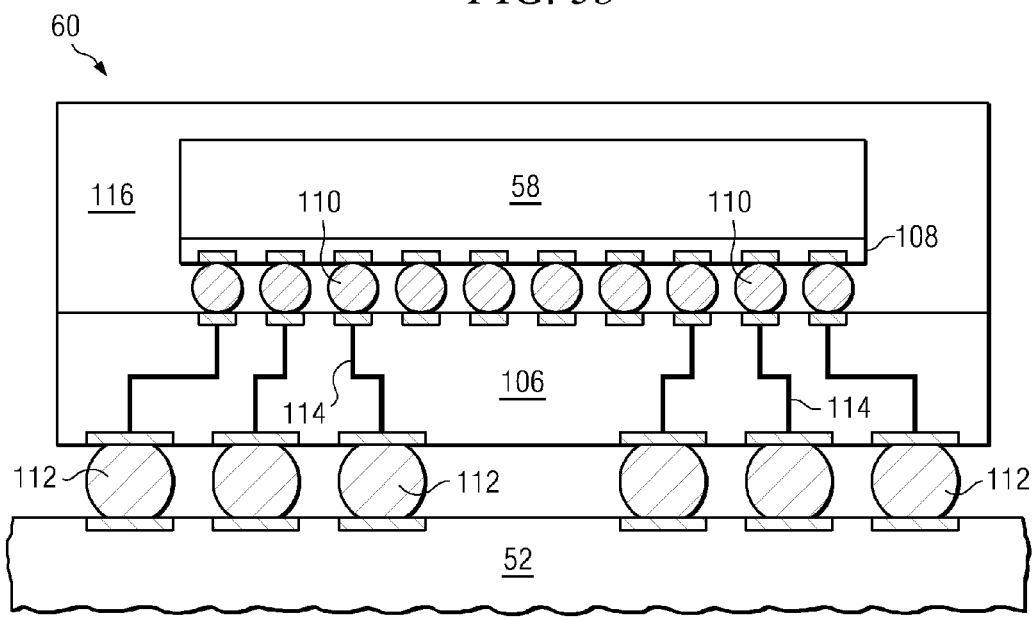

Flip chip semiconductor packages and wafer level packages (WLP) are commonly used with integrated circuits (ICs) demanding high speed, high density, and greater pin count. In FIG. 5c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through interconnects 110.

BGA 60 is electrically and mechanically connected to PCB 52 with a BGA style second level packaging using interconnects 112. Semiconductor die 58 is electrically connected to conductive signal traces 54 in PCB 52 through interconnects 110, signal lines 114, and interconnects 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance.

In another embodiment, active area 108 of semiconductor die 58 is directly mounted facedown to PCB 115, i.e., without an intermediate carrier, as shown in FIG. 5d. Bump pads 111 are formed on active area 108 using an evaporation, electrolytic plating, electroless plating, screen printing, or other suitable metal deposition process. Bump pads 111 connect to the active and passive circuits by conduction tracks in active area 108. Bump pads 111 can be Al, Sn, Ni, Au, Ag, or Cu. An electrically conductive bump material is deposited over bump pads 111 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux material. For example, the bump material can be eutectic Sn/Pb, high-lead solder, or lead-free solder. The bump material is bonded to die bump pads 160 using a suitable attachment or bonding process. In one embodiment, the bump material is reflowed by heating the material above its melting point to form spherical balls or bumps 117. In some applications, bumps 117 are reflowed a second time to improve electrical contact to bump pads 111. The flip chip semiconductor device provides a short electrical conduction path from the active devices on semiconductor die 58 to conduction tracks on PCB 115 in order to reduce signal propagation, lower capacitance, and achieve overall better circuit performance.

FIGS. 6a and 6b illustrate a top view and cross-sectional view of a portion of flip chip type semiconductor die 120 with die bump pad 122. Trace line 124 is a straight conductor with integrated bump pad 126 formed on substrate or PCB 130. FIGS. 7a and 7b show further detail of substrate bump pad 126 along trace line 124. The substrate bump pad 126 can be rounded as shown in FIG. 7a, or rectangular as shown in FIG. 7b. The sides of substrate bump pad 126 may be co-linear with trace line 124.

An electrically conductive bump material is deposited over die bump pad 122 or substrate bump pad 126 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to die bump pad 122 and substrate bump pad 126 using a suitable attachment or bonding process. In one embodiment, the bump material is reflowed by heating the material above its melting point to form interconnect 132. In some applications, interconnect 132 is reflowed a second time to improve electrical contact between die bump pad 122 and substrate bump pad 126. The bump material around the narrow substrate bump pad 126 maintains die placement during reflow. Although interconnect 132 is shown connected to trace line 124 as a bump-on-lead (BOL), the interconnect can also be formed over a bump pad on substrate 130 having an area on the same order or greater than die bump pad 122. An optional underfill material 138 is deposited between semiconductor die 120 and substrate 130.

In high routing density applications, it is desirable to minimize escape pitch of trace lines 124. The escape pitch between trace lines 124 can be reduced by eliminating the solder mask for reflow containment, i.e., by reflowing the bump material without a solder mask. Solder mask 140 may be formed over a portion of substrate 130. However, solder mask 140 is not formed over substrate bump pad 126 of trace line 124 for reflow containment. That is, the portion of trace line 124 designed to mate with the bump material is devoid of any SRO of solder mask 140. Since no SRO is formed around die bump pad 122 or substrate bump pad 126, trace lines 124 can be formed with a finer pitch, i.e., trace lines 124 can be disposed closer together or to nearby structures. Without solder mask 140, the pitch between trace lines 124 is given as P=D+PLT+W/2, wherein D is the base diameter of interconnect 132, PLT is die placement tolerance, and W is the width of the trace line 124. In one embodiment, given a bump base diameter of 100 μm, PLT of 10 μm, and trace line width of 30 μm, the minimum escape pitch of trace line 124 is 125 μm. The solder mask-less bump formation eliminates the need to account for the ligament spacing of solder mask material between adjacent openings, SRT, and minimum resolvable SRO, as found in the prior art.

When the bump material is reflowed without a solder mask to metallurgically and electrically connect die bump pad 122 to substrate bump pad 126, the wetting and surface tension causes the bump material to maintain self-confinement and be retained within the space between die bump pad 122 and substrate bump pad 126 and portion of substrate 130 immediately adjacent to trace line 124 substantially within the footprint of the bump pads.

To achieve the desired self-confinement property, the bump material can be immersed in a flux solution prior to placement on die bump pad 122 or substrate bump pad 126 to selectively render the region contacted by the bump material more wettable than the surrounding area of trace line 124. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, solder mask 140 is not needed around die bump pad 122 or substrate bump pad 126.

Figure 8:
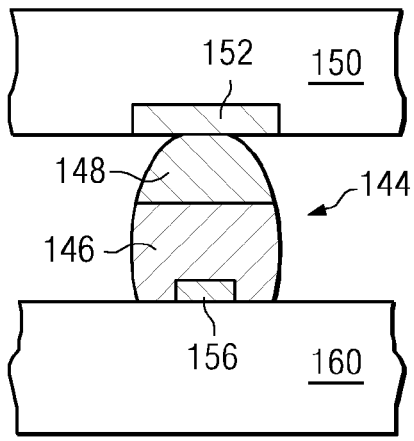
FIG. 8 shows a composite interconnect with non-fusible base and fusible cap.

In another embodiment, a composite interconnect 144 is formed between die bump pad 122 and substrate bump pad 126 to achieve the desired self-confinement of the bump material. Composite interconnect 144 includes a non-fusible base 146 made of Cu, Au, Sn, Ni, and Pb, and a fusible cap 148 made of solder, Sn, or indium, as shown in FIG. 8. The volume of fusible bump material in relation to the non-fusible base material is selected to ensure self-confinement by virtue of surface tension forces. During reflow, the fusible base material is self-confined around the non-fusible base material. The fusible bump material around the non-fusible base also maintains die placement during reflow. In general, the height of composite interconnect 144 is the same or less than the diameter of the bump. In some cases, the height of composite interconnect 144 is greater than the diameter of the interconnect. In one embodiment, given a bump base diameter of 100 μm, the non-fusible base 146 is about 45 μm in height and the fusible cap 148 is about 35 μm in height. The molten bump material remains confined substantially within the area defined by the bump pads because the volume of bump material deposited to form composite bump 144, including non-fusible base 146 and fusible cap 148, is selected so that the resulting surface tension is sufficient to retain the bump material substantially within the footprint of the bump pads and prevent run-out to unintended adjacent or nearby areas. Hence, solder mask 140 is not needed around die bump pad 122 or substrate bump pad 126, which reduces trace line pitch and increases routing density.

Figure 9A:
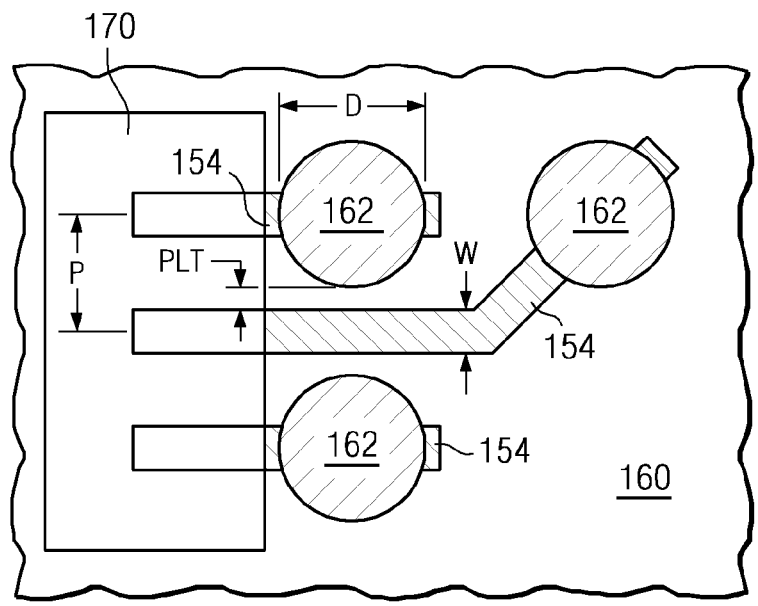
FIGS. 9*a*-9*b* illustrate an alternate embodiment of the semiconductor device with interconnects reflowed on trace lines without a solder mask.
Figure 9B:
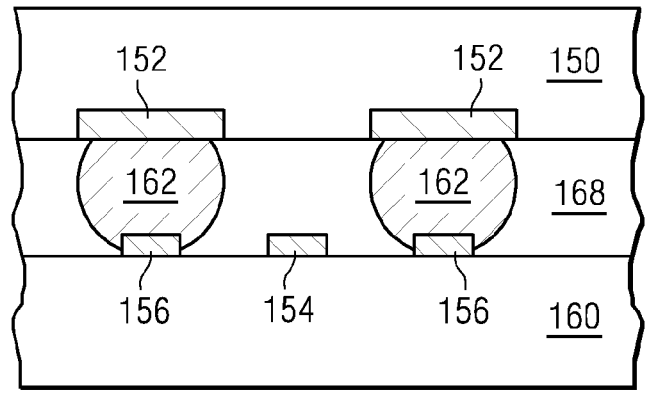

FIGS. 9a and 9b illustrate a top view and cross-sectional view of another embodiment with flip chip type semiconductor die 150 having die bump pad 152. Trace line 154 is a straight conductor with integrated bump pad 156 formed on substrate or PCB 160, similar to FIGS. 7a and 7b. In this embodiment, bump pads 156 are arranged in multiple or offset rows. Accordingly, alternate trace lines 154 include an elbow for routing to bump pads 156.

An electrically conductive bump material is deposited over die bump pad 152 or substrate bump pad 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to die bump pad 152 and substrate bump pad 156 using a suitable attachment or bonding process. In one embodiment, the bump material is reflowed by heating the material above its melting point to form interconnect 162. In some applications, interconnect 162 is reflowed a second time to improve electrical contact between die bump pad 152 and substrate bump pad 156. The bump material around the narrow substrate bump pad 156 maintains die placement during reflow. Although interconnect 162 is shown connected to trace line 154 as BOL, the bump material can also be reflowed over a bump pad on substrate 160 having an area on the same order or greater than die bump pad 152. An optional underfill material 168 is deposited between semiconductor die 150 and substrate 160.

In high routing density applications, it is desirable to minimize escape pitch. In order to reduce the pitch between trace lines 154, the bump material is reflowed without a solder mask. The escape pitch between trace lines 154 can be reduced by eliminating the solder mask for solder reflow containment, i.e., by reflowing the bump material without a solder mask. Solder mask 170 may be formed over a portion of substrate 160. However, solder mask 170 is not formed over substrate bump pad 156 of trace line 154 for solder reflow containment. That is, the portion of trace line 154 designed to mate with the bump material is devoid of an SRO of solder mask 170. Since no SRO is formed around die bump pad 152 or substrate bump pad 156, trace lines 154 can be formed with a finer pitch, i.e., trace lines 154 can be disposed closer to adjacent structures.

Without solder mask 170, the pitch between trace lines 154 is given as P=D/2+PLT+W/2, wherein D is the base diameter of bump 162, PLT is die placement tolerance, and W is the width of the trace line 154. In one embodiment, given a bump diameter of 100 μm, PLT of 10 μm, and trace line width of 30 μm, the minimum escape pitch of trace line 154 is 75 μm. The solder mask-less bump formation eliminates the need to account for the ligament spacing of solder mask material between adjacent openings, SRT, and minimum resolvable SRO, as found in the prior art.

When the bump material is reflowed without a solder mask to metallurgically and electrically connect die bump pad 152 of semiconductor die 150 to substrate bump pad 156 of trace line 154, the wetting and surface tension causes the bump to maintain self-confinement and be retained within the space between die bump pad 152 and substrate bump pad 156 and portion of substrate 160 immediately adjacent to trace line 154 substantially within the footprint of the bump pads.

To achieve the desired self-confinement property, the bump material can be immersed in a flux solution prior to placement on die bump pad 152 or substrate bump pad 156 to selectively render the region contacted by the bump material more wettable than the surrounding area of trace line 154. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, solder mask 170 is not needed around die bump pad 152 or substrate bump pad 156.

In another embodiment, a composite interconnect is formed between die bump pad 152 and substrate bump pad 156 to achieve the desired self-confinement of the bump material. The composite interconnect includes a non-fusible base made of Cu, Au, Sn, Ni, or Pb, and a fusible cap made of solder, Sn, or indium, similar to FIG. 8. The height or volume of fusible bump material in relation to the non-fusible base material is selected to ensure self-confinement by virtue of surface tension forces. During reflow, the fusible base material is self-confined around the non-fusible base material. The fusible bump material around the non-fusible base also maintains die placement during reflow. In general the height of the composite interconnect is the same or less than the diameter of the bump. In some cases, the height of the composite interconnect is greater than the diameter of the interconnect. In one embodiment, given a bump base diameter of 100 μm, the non-fusible base is about 45 μm in height and the fusible cap is about 35 μm in height. The molten bump material remains confined substantially within the area defined by the bump pads because the volume of bump material deposited to form the composite bump, including non-fusible base and fusible cap, is selected so that the resulting surface tension is sufficient to retain the bump material substantially within the footprint of the bump pads and prevent run-out to unintended adjacent or nearby areas. Hence, solder mask 170 is not needed around die bump pad 152 or substrate bump pad 156, which reduces trace line pitch and increases routing density.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate including a first conductive layer comprising an interconnect site, wherein an escape pitch of the first conductive layer is given D+PLT+W/2, wherein D is a base diameter of the interconnect structure, PLT is a die placement tolerance, and W is a width of the first conductive layer;
    forming an interconnect structure over the interconnect site of the first conductive layer;
    immersing the interconnect structure in a flux solution to selectively render the interconnect site more wettable than an area of the first conductive layer away from the interconnect site; and
    reflowing the interconnect structure to be self-confined over a top surface and side surfaces of the first conductive layer substantially within an area of the interconnect site by surface tension without a solder mask around the interconnect site.

2. The method of claim 1, wherein the substrate includes a semiconductor die.

3. The method of claim 1, wherein the interconnect structure includes a stud bump.

4. The method of claim 1, further including forming an insulating layer over the substrate in a location away from the interconnect site.

5. The method of claim 1, wherein the interconnect site includes a width of less than 120% of a width of the first conductive layer.

6. A method of making a semiconductor device, comprising:
   providing a first substrate including a first conductive layer;
   immersing an interconnect structure in a flux solution; and
   disposing the interconnect structure self-confined over the first conductive layer by the flux solution, wherein an escape pitch of the first conductive layer is given D+PLT+W/2, wherein D is a base diameter of the interconnect structure, PLT is a die placement tolerance, and W is a width of the first conductive layer.

7. A semiconductor device, comprising:
   a first substrate including a first conductive layer with an interconnect site, wherein an escape pitch of the first conductive layer is given D+PLT+W/2, wherein D is a base diameter of the interconnect structure, PLT is a die placement tolerance, and W is a width of the first conductive layer; and
   an interconnect structure self-confined over a top surface and side surfaces of the first conductive layer substantially within an area of the interconnect site by surface tension.

8. The semiconductor device of claim 7, further including a second substrate including a second conductive layer disposed over the interconnect structure.

9. The semiconductor device of claim 8, wherein the first substrate or the second substrate includes a semiconductor die.

10. The semiconductor device of claim 7, wherein the first conductive layer includes a trace or a bump pad.

11. The semiconductor device of claim 7, wherein a height of the interconnect structure is greater than a diameter of the interconnect structure.

12. The semiconductor device of claim 7, wherein the interconnect structure includes a stud bump.

13. A method of making a semiconductor device, comprising:
   providing a first substrate including a first conductive layer, wherein an escape pitch of the first conductive layer is given D+PLT+W/2, wherein D is a base diameter of the interconnect structure, PLT is a die placement tolerance, and W is a width of the first conductive layer;
   immersing an interconnect structure in a flux solution to selectively render an interconnect site on the conductive layer more wettable than an area of the first conductive layer away from the interconnect site; and
   disposing the interconnect structure self-confined over a top surface and side surfaces of the first conductive layer substantially within an area of the interconnect site by surface tension.

14. The method of claim 13, further including disposing a second substrate including a second conductive layer over the interconnect structure.

15. The method of claim 14, wherein the first substrate or the second substrate includes a semiconductor die.

16. The method of claim 13, wherein a height of the interconnect structure is greater than a diameter of the interconnect structure.

17. The method of claim 13, further including forming a flux solution over the interconnect structure.

18. The method of claim 13, further including forming the interconnect structure without a solder mask.

19. A semiconductor device, comprising:
   a first substrate including a first conductive layer with an interconnect site, wherein an escape pitch of the first conductive layer is given D+PLT+W/2, wherein D is a base diameter of the interconnect structure, PLT is a die placement tolerance, and W is a width of the first conductive layer; and
   an interconnect structure reflowed and self-confined over a top surface and side surfaces of the first conductive layer substantially within an area of the interconnect site by surface tension.

20. The semiconductor device of claim 19, further including a second substrate including a second conductive layer disposed over the interconnect structure.

21. The semiconductor device of claim 20, wherein the first substrate or the second substrate includes a semiconductor die.

22. The semiconductor device of claim 19, further including an underfill material formed around the interconnect structure.

23. The semiconductor device of claim 19, wherein the interconnect structure includes a stud bump.

24. The semiconductor device of claim 19, wherein a height of the interconnect structure is greater than a diameter of the interconnect structure.

* * * * *